United States Patent
Steiner et al.

(10) Patent No.: US 12,149,219 B2
(45) Date of Patent: Nov. 19, 2024

(54) TRANSCONDUCTOR CIRCUITRY WITH ADAPTIVE BIASING

(71) Applicant: ams AG, Premstätten (AT)

(72) Inventors: Matthias Steiner, Premstätten (AT); Nigel Greer, Hottot les Bagues (FR)

(73) Assignee: AMS AG, Premstätten (AT)

(*) Notice: Subject to any disclaimer, the term of this patent is extended or adjusted under 35 U.S.C. 154(b) by 760 days.

(21) Appl. No.: 17/414,603

(22) PCT Filed: Dec. 3, 2019

(86) PCT No.: PCT/EP2019/083477
§ 371 (c)(1),
(2) Date: Jun. 16, 2021

(87) PCT Pub. No.: WO2020/126475
PCT Pub. Date: Jun. 25, 2020

(65) Prior Publication Data
US 2022/0052660 A1 Feb. 17, 2022

(30) Foreign Application Priority Data
Dec. 20, 2018 (EP) .................................. 18214610

(51) Int. Cl.
*H03F 3/45* (2006.01)
(52) U.S. Cl.
CPC ..... *H03F 3/45475* (2013.01); *H03F 3/45179* (2013.01); *H03F 3/45659* (2013.01);
(Continued)
(58) Field of Classification Search
CPC ............ H03F 3/45475; H03F 3/45179; H03F 3/45659; H03F 3/45708;
(Continued)

(56) References Cited

U.S. PATENT DOCUMENTS

| 5,283,535 A | 2/1994 | Sevenhans et al. |
| 6,023,196 A | 2/2000 | Ashby et al. |

(Continued)

FOREIGN PATENT DOCUMENTS

| EP | 0534007 A1 | 3/1993 |
| JP | 2006121608 A | 5/2006 |

(Continued)

OTHER PUBLICATIONS

First Office Action issued in Corresponding Chinese Patent Application No. 201980084651.4 dated Jan. 18, 2024, with English language translation, 8 pages.

(Continued)

*Primary Examiner* — Andrea Lindgren Baltzell
*Assistant Examiner* — Jose E Pinero
(74) *Attorney, Agent, or Firm* — MH2 Technology Law Group LLP

(57) ABSTRACT

A transconductor circuitry (10) with adaptive biasing comprises a first input terminal (E10a) to apply a first input signal (inp), and a second input terminal (E10b) to apply a second input signal (inn). A control circuit (200) is configured to control a first controllable current source (110) in a first current path (101) and a second controllable current source (120) in a second current path (102) in response to at least one of a first potential of a first node (N1) of the first current path (101) and a second potential of a second node (N2) of the second current path (102). The first node (N1) is located between a first transistor (150) and the first controllable current source (110), and the second node (N2) is located between a second transistor (160) and the second controllable current source (120).

14 Claims, 7 Drawing Sheets

(52) U.S. Cl.
CPC ............... *H03F 3/45708* (2013.01); *H03F 2203/45061* (2013.01); *H03F 2203/45078* (2013.01); *H03F 2203/45288* (2013.01)

(58) Field of Classification Search
CPC . H03F 2203/45061; H03F 2203/45078; H03F 2203/45288; H03F 2203/45366; H03F 2203/45418; H03F 2203/45424; H03F 2203/45471; H03F 2203/45491; H03F 3/45672; H03F 3/4569; H03F 3/45717; H03F 3/45739; H03F 3/45197
USPC ........................................................ 330/252
See application file for complete search history.

(56) References Cited

U.S. PATENT DOCUMENTS

| | | | |
|---|---|---|---|
| 6,727,757 | B1 | 4/2004 | Venkatraman et al. |
| 7,321,259 | B1 | 1/2008 | Shumarayev |
| 7,605,645 | B2 | 10/2009 | Morie et al. |
| 2005/0285678 | A1 | 12/2005 | Kaviani et al. |
| 2006/0261894 | A1 | 11/2006 | Capofreddi et al. |
| 2017/0359036 | A1 | 12/2017 | Frohlich et al. |
| 2020/0186098 | A1* | 6/2020 | Basilico .................. H03F 1/086 |

FOREIGN PATENT DOCUMENTS

| | | |
|---|---|---|
| JP | 201229206 A | 2/2012 |
| JP | 2015115654 A | 6/2015 |
| JP | 2018174477 A | 11/2018 |
| WO | 2006125063 A2 | 11/2006 |

OTHER PUBLICATIONS

Barbieri, A. et al.: "A Differential Difference Amplifier with Dynamic Resistive Degeneration for MEMS" 2016 IEEE ESSCIRC, 978-1-5090-2972-3/15 pp. 285-288.

Calvo, B. et al.: "Linear-enhanced V to I converters based on MOS resistive source degeneration" 2008 IEEE ISCAS, 978-1-4244-1684-4/08, pp. 3118-3121.

De Berti, C. et al.: "A 106 dB A-Weighted DR Low-Power Continuous-Time $\Sigma\Delta$ A Modulator for MEMS Microphones" IEEE Journal of Solidstate Circuits, vol. 51, No. 7, Jul. 2016, pp. 1607-1618.

Degrauwe, M. et al.: "Adaptive Biasing CMOS Amplifiers" IEEE Journal of Solidstate Circuits, vol. SC-17, No. 3, Jun. 1982, pp. 522-528.

Elamien, M. et al.: "A Linear CMOS Balanced Output Transconductor Using Double Differential Pair with Source Degeneration and Adaptive Biasing" 2016 IEEE 59th International Midwest Symposium on Circuits and Systems (MWSCAS), Oct. 16-19, 2016, Abu Dhabi, UAE.

Fedi, G., International Search Report and Written Opinion mailed Feb. 4, 2020 for corresponding International Application No. PCT/EP2019/083477, 12 pages.

Ibrahim, M. et al.: "Linear Input Range Extension for Low-Voltage Operational Transconductance Amplifiers in Gm-C Filters" 2017 IEEE ISCAS, 978-1-4673-6853-7/17.

Silva-Martinez, J., et al: "Design Techniques for High-Performance Full-CMOS OTA-RC Continuous-Time Filters" IEEE Journal of solid-state circuits, vol. 27, No. 7, Jul. 1992—pp. 993-1001.

Van Der Zwan, E. et al.: "A 0.2-mW CMOS sigma-delta Modulator for Speech Coding with 80 dB Dynamic Range" IEEE Journal of Solidstate Circuits, vol. 31, No. 12, Dec. 1996, pp. 1873-1880.

Zare-Hoseini, H. et al.: "A Low-Power Continuous-Time $\Delta\Sigma$ Modulator for Electret Microphone Applications" IEEE Asian Solid-State Circuits Conference Nov. 8-10, 2010 / Beijing, China.

Pare-Hoseini, H. et al.: "Highly linear transconductance topology using floating transistors" 2006 Iee EL, Jan. 5, 2006 vol. 42 No. 1.

* cited by examiner

TRANSCONDUCTOR CIRCUITRY WITH ADAPTIVE BIASING

CROSS-REFERENCE TO RELATED APPLICATIONS

The present application is the national stage entry of International Patent Application No. PCT/EP2019/083477, filed on Dec. 3, 2019, and published as WO 2020/126475 A1 on Jun. 25, 2020, which claims the benefit of priority of European Patent Application No. 18214610.0, filed on Dec. 20, 2018, all of which are incorporated by reference herein in their entirety.

TECHNICAL FIELD

The disclosure relates to a transconductor circuitry with adaptive biasing of the input transistors of the transconductor circuitry. The disclosure further relates to a sensor device comprising a transconductor circuitry with adaptive biasing of its input transistors.

BACKGROUND

A sensor device, for example a MEMS microphone, to detect a sound pressure impacting on a transducer of the MEMS microphone usually provides an analog output signal which is converted by a subsequent analog-to-digital converter (ADC) stage to a digital signal. The ADC may generate a stream of digital values in response to an input signal which depends on the output signal of the sensor device. Regarding a sensor device based on a MEMS microphone, the ADC is usually built with discrete time switched capacitors which require an input voltage. As a consequence, a preceding amplifier which is arranged between the MEMS transducer and the ADC must be a voltage buffer or a voltage gain stage.

If it is desired to replace the discrete time switched capacitor ADC by a continuous time ADC topology, a transconductor circuitry has to be used which is able to convert the voltage output signal of the capacitive (MEMS-) microphone sensor into a differential current which is applied as input signal to a subsequent continuous time ADC stage. The ADC then converts the received output current of the transconductor circuitry to a digital signal.

There is a need to provide a transconductor circuitry with adaptive biasing, that may be used as an interface between a sensor device, for example a sensor device comprising a MEMS sensor, and a subsequent analog-to-digital circuit with continuous time front-end. A further desire is to provide a sensor device comprising a sensor, wherein an analog output signal of the sensor is converted into a digital signal by an ADC with continuous time topology.

SUMMARY

An embodiment of a transconductor circuitry with adaptive biasing which may be used to convert an output voltage signal from a sensor device, for example a capacitive microphone sensor, into a differential current which can be used as an input signal for a subsequent ADC with continuous time topology is specified in claim 1.

According to a possible embodiment of the transconductor circuitry with adaptive biasing, the circuitry comprises a first input terminal to apply a first input signal, and a second input terminal to apply a second input signal. The transconductor circuitry further comprises a first current path including a first transistor and a first controllable current source to adjust a first biasing current of the first transistor in the first current path. The first transistor has a control node being coupled to the first input terminal. Furthermore, the transconductor circuitry comprises a second current path including a second transistor and a second controllable current source to adjust a second biasing current of the second transistor in the second current path. The second transistor has a control node being coupled to the second input terminal.

The transconductor circuitry further comprises a control circuit being configured to control the first and the second controllable current source in response to at least one of a first potential of a first node of the first current path and a second potential of a second node of the second current path. The first node is located between the first transistor and the first controllable current source. The second node is located between the second transistor and the second controllable current source.

The proposed topology of the transconductor circuitry advantageously enables to convert a voltage signal received at the first and second input terminal from a sensor device, for example a sensor device comprising a capacitive microphone sensor, to a proportional output current with high efficiency. In particular, the transconductor circuitry has a low current consumption and shows low noise at small signals and, at the same time, still reasonable signal distortion at large signals.

According to a possible embodiment of the transconductor circuitry, the control circuit comprises an amplifier having an output node to generate a control signal to control the first and second controllable current source. The transconductor circuitry comprises a linking current path being arranged between the first current path and the second current path. An input node of the amplifier of the control circuit may be connected to an internal node of the linking current path.

The configuration of the transconductor circuitry advantageously enables that the control circuit detects a sensing signal, for example a sensing voltage, at the internal node of the linking current path. The internal signal is tapped at a center node of the differential transistor pair of the first and second transistor. The control circuit is configured to generate the control signal to regulate/adjust the respective biasing current in the first and the second current path in response to the sensing signal.

The transconductor circuitry advantageously exploits the observation that the sensing signal/sensing voltage at the internal node of the linking current path increases with larger differential input signal applied at the first and second input terminal, as the respective operating point of the first and second transistor shift away from its respective idle point at zero input signal, i.e. a differential input signal having the zero level. The sensing signal/sensing voltage at the internal node of the linking current path is therefore a measure of "how non-linear" the differential transistor pair of the first and second transistor has already become, and is used as a control signal/voltage for adaptive biasing.

According to another embodiment of the transconductor circuitry, the linking current path may comprise a first resistive element and a second resistive element. The first resistive element may be arranged in the linking current path between the first node of the first current path and the internal node of the linking current path. The second resistive element may be arranged in the linking current path between the second node of the second current path and the internal node of the linking current path.

The first and the second resistive elements act as degeneration resistors which allow to shift the first and the second potential to the potential at the internal node of the linking current path. According to this embodiment, the control circuit detects the sensing signal/voltage at the internal node of the linking current path, i.e. at the center node of the differential transistor pair of the first and second transistor. Since the sensing signal/voltage at the internal node of the linking current path also increases according to the embodiment of the transconductor circuitry comprising the first and second resistive element, as the respective operating point of the first and second transistor shift away from its respective idle point at zero differential input signal, the transconductor circuitry may advantageously use the sensing signal/voltage as a measure of the degree of non-linearity of the differential transistor pair. The sensing signal/voltage can be used by the control circuit as a control signal for adaptive biasing.

Since, undesirably, the sensing signal/voltage at the internal node of the linking current path is directly affected by a common mode voltage at the first and second input terminal, i.e. at a respective control node of the first and second transistor, a reference generator with an auxiliary transistor pair may be advantageously introduced in the transconductor circuitry to make the adaptive biasing robust against changes of the common mode voltage. In order to realize the auxiliary transistor pair, the control circuit of the transconductor circuitry may comprise a third current path and a fourth current path.

The third current path may include a third transistor and a constant current source to generate a biasing current of the third transistor in the third current path. The third transistor has a control node being coupled to the first input terminal. The fourth current path includes a fourth transistor and a second constant current source to generate another biasing current of the fourth transistor in the fourth current path. The fourth transistor has a control node being coupled to the second input terminal.

The amplifier of the control circuit may comprise a second input node to apply a reference signal. This configuration of the control circuit allows to compare the sensing signal at the internal node with a defined level of the reference signal. The second input node of the amplifier of the control circuit to apply the reference signal is coupled to the third and the fourth current path. This means that the reference signal of the amplifier is advantageously changed in response to a third potential at a third node of the third current path and in response to a fourth potential of a fourth node of the fourth current path. The third node may be located between the third transistor and the first constant current source. The fourth node may be located between the fourth transistor and the second constant current source.

The proposed topology of the control circuit advantageously enables to generate the reference signal that moves synchronously with an input common mode voltage at the first and second input terminal of the transconductor circuitry. The control circuit thus only detects an increase of the level of the sensing signal caused by the change of the respective operating point of the first and second transistor. As a result, the control scheme to control the generation of the biasing currents of the first and second transistor is immune against variations of the input common mode voltage.

An embodiment of a sensor device which uses the proposed transconductor circuitry is specified in claim 14.

According to a possible embodiment, the sensor device comprises transconductor circuitry with adaptive biasing as specified above or defined in any of the claims 1 to 13. The transconductor circuitry is configured to generate an output current signal. The sensor device further comprises a sensor including a transducer to detect an environmental signal impacting on the transducer. The transducer is configured to generate a voltage signal in response to the environmental signal. The sensor device further comprises an analog-to-digital converter having an input side to receive the output current signal. The analog-to-digital converter is configured to generate a digital output signal in response to the output current signal.

The transconductor circuitry is connected to the sensor to receive the voltage signal from the sensor at the first and second input terminal of the transconductor circuitry. The transconductor circuitry is further connected to the analog-to-digital converter to provide the output current signal to the input side of the analog-to-digital converter.

The sensor device advantageously enables to use the transconductor circuitry as an interface between the sensor and the analog-to-digital converter. The analog-to-digital converter may be designed with continuous time front-end. The design of the transconductor circuitry enables to provide the transconductor circuitry with a very high input impedance being larger than 100 GOhm and being smaller than 1 pF to not dampen the sensor signal. The design of the transconductor circuitry advantageously enables to provide a defined transconductance for accurate system gain, to provide a linear characteristic up to high signal levels for good distortion (THD) performance and, in the case of a microphone sensor, high acoustic overload point (AOP). Furthermore, the transconductor circuitry has a low noise for high system signal-to-noise ratio (SNR), and consume little power particularly if no or little input signals are present.

The accompanying drawings are included to provide a further understanding and are incorporated in and constitute a part of this specification. The drawings illustrate several embodiments of the transconductor circuitry with adaptive biasing, and together with the description serve to explain principles and the operation of the various embodiments of the transconductor circuitry.

DETAILED DESCRIPTION

Figure 1:
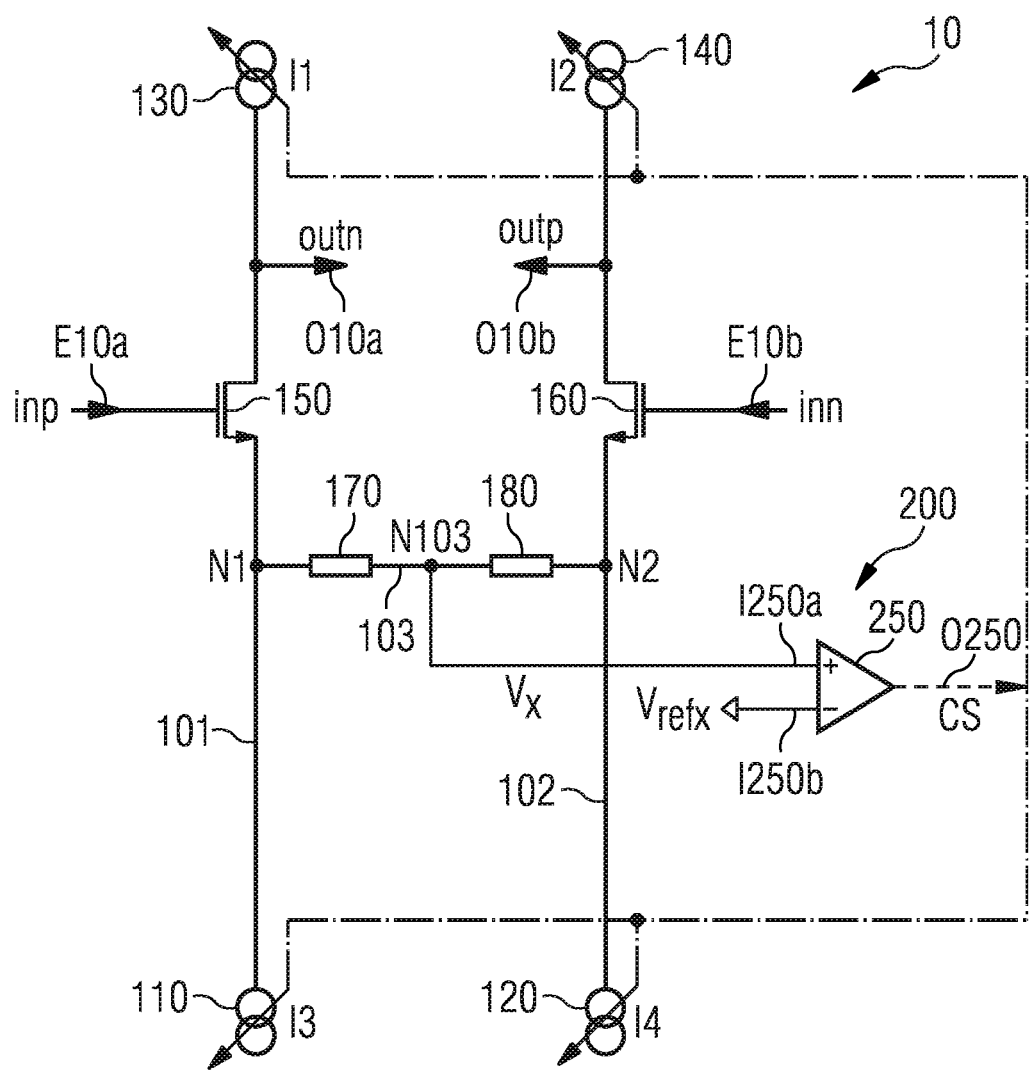
FIG. 1 shows a first embodiment of a transconductor circuitry with adaptive biasing in response to a differential input signal level of the transconductor circuitry.

FIG. 1 shows a first embodiment of a transconductor circuitry 10 with adaptive biasing, wherein the biasing current is changed in response to a differential input signal. The transconductor circuitry comprises an input terminal E10a to apply an input signal inp, and an input terminal E10b to apply an input signal inn.

The transconductor circuitry 10 further comprises a current path 101 including a transistor 150 and a controllable current source 110 to adjust a first biasing current of the transistor 150. The transistor 150 has a control node being coupled to the input terminal E10a. In particular, the gate terminal of the transistor 150 is coupled to the input terminal E10a of the transconductor circuitry to receive the input signal inp.

The transconductor circuitry 10 further comprises a current path 102 including a transistor 160 and a controllable current source 120 to adjust a second biasing current of the transistor 160. The transistor 160 has a control node being coupled to the input terminal E10b. In particular, a gate node of the transistor 160 is coupled to the input terminal E10b to receive the input signal inn.

The transconductor circuitry 10 shown in FIG. 1 further comprises a control circuit 200 being configured to control the controllable current sources 110, 120 in response to at least one of a first potential of a node N1 of the current path 101 and a second potential of a node N2 of the current path 102. The node N1 of the current path 101 is located between the transistor 150 and the controllable current source 110. The node N2 of the current path 102 is located between the transistor 160 and the controllable current source 120.

As shown in FIG. 1, the transconductor circuitry 10 comprises an output terminal O10a to generate an output signal outn. The output terminal O10a is connected to a drain terminal of the transistor 150. The transconductor circuitry 10 further comprises an output terminal O10b to output an output signal outp. The output terminal O10b is connected to a drain terminal of the transistor 160.

As shown in FIG. 1, the control circuit 200 comprises an amplifier 250 which has an output node O250 to generate a control signal CS to control the controllable current sources 110 and 120. The amplifier 250 may be configured as a transconductance amplifier. The amplifier 250 comprises an input node I250a which is coupled to the current paths 101, 102 in a way so that a sensing signal Vx applied at the input node I250a of the amplifier 250 is changed in response to at least one of the first potential of the node N1 and the second potential of the node N2.

The transconductor circuitry 10 of FIG. 1 comprises a linking current path 103 which is arranged between the node N1 of the current path 101 and the node N2 of the current path 102. The input node I250a of the amplifier 250 of the control circuit 200 is connected to an internal node N103 of the linking current path 103. The control circuit 200 is configured to generate the control signal CS by the amplifier 250 to control the controllable current sources 110, 120 in response to the sensing signal Vx detected at the internal node N103 of the linking current path 103.

As shown for the embodiment of the transconductor circuitry 10 of FIG. 1, the linking current path 103 may comprise a resistive element 170 and a resistive element 180. Both of the resistive elements 170 and 180 may be configured as a resistor having the same resistance. As shown according to the embodiment of the transconductor circuitry 10 of FIG. 1, the resistive element 170 is connected between the node N1 of the current path 101 and the internal node N103 of the linking current path 103. The resistive element 180 is connected between the node N2 of the current path 102 and the internal node N103 of the linking current path 103.

Referring to FIG. 1, the amplifier 250 further comprises an input node I250b to apply a reference signal Vrefx. In particular, the amplifier 250 is configured to generate the control signal CS in response to the sensing signal Vx and the reference signal Vrefx.

According to the embodiment of the transconductor circuitry 10 shown in FIG. 1, the current path 101 may include a controllable current source 130. The current path 102 may include a controllable current source 140. The output terminal O10a is arranged between the transistor 150 and the controllable current source 130. The output terminal O10b is arranged between the transistor 160 and the controllable current source 140.

The control circuit 200 is configured to control the controllable current sources 130 and 140 in response to the first potential of the node N1 of the current path 101 and in response to the second potential of the node N2 of the current path 102. According to the embodiment of the transconductor circuitry 10 shown in FIG. 1, the control circuit 200 is configured to generate the control signal CS by the amplifier 250 to control the controllable current sources 110, 120 and the controllable current sources 130, 140 in response to the sensing signal Vx detected at the internal node N103 of the linking current path 103.

The following explains how the transconductor circuitry 10 shown in FIG. 1 works. For better understanding the principle, it is assumed that the transconductor circuitry 10 would not comprise the control circuit 200 to control the controllable current sources 110, 120 and optionally the controllable current sources 130 and 140. A differential input voltage is applied to the transconductor circuitry 10 by applying a first input signal inp to the input terminal E10a and applying a second input signal inn to the input terminal E10b. Furthermore, both of the output terminals O10a, O10b are kept at a constant voltage by a load circuitry coupled to the output terminals O10a, O10b (not shown in FIG. 1).

In the case of a little differential input signal applied to the input terminals E10a and E10b, the transistors 150 and 160 respectively change their source current only by a little, leaving their operating point almost constant. As a consequence, the differential input voltage is attenuated and transferred to node N1 and node N2 in a reasonably linear way. Regarding the embodiment of the transconductor circuitry 10 shown in FIG. 1, the current flowing in the linking current path 103 is proportional to the differential input voltage. This current is output at the drain nodes of transistors 150 and 160, i.e. at the output terminals O10a and O10b.

When the differential input voltage increases, for example by increasing the level/potential of the input signal inp and lowering the level/potential of the input signal inn, the respective operating point of transistors 150 and 160 changes, because the current flowing through the conductive path of transistors 150 and 160 also changes. As a result, the respective transconductance of both of the transistors 150 and 160 changes in different ways so that the generated output current at the output terminals no longer depends linearly on the differential input voltage.

Referring to FIG. 1, the transconductor circuitry 10 is provided with the control circuit 200 which adjusts the biasing current of the transistors 150 and 160 in response to the differential input signal level. In particular, the control circuit 200 is configured as a special adaptive biasing circuit which increases the bias current through transistors 150 and 160 depending on the differential input signal voltage applied at the input terminals E10a and E10b.

The proposed topology of the transconductor circuitry 10 exploits the observation that the sensing signal Vx between the resistive elements 170 and 180 increases gradually as a differential input voltage at the input terminals E10a and E10b increases (with either polarity) which stems from the non-linear behaviour of transistors 150 and 160. The more transistors 150 and 160 are pulled away from their idle operating point at zero differential input signal level, the higher the level of the sensing signal Vx becomes.

Ultimately, if for example the differential input voltage is very large and positive, for example the level of the input signal inp at the input terminal E10a is high and the level of the input signal inn at the input terminal E10b is low, transistor 160 is turned off completely, and the sensing signal Vx will directly follow the level of the input signal inp with transistor 150 acting as a source follower.

The level of the sensing signal Vx is therefore a good indicator for the operating points of transistors 150 and 160, reflecting how one of them is losing bias current. Thus, the sensing signal Vx can be used to gradually steer additional bias current into the circuit to prevent an excessively non-linear transfer characteristic or even the turn-off of transistors 150 or 160.

This behaviour is accomplished with the control circuit 200 comprising a regulator circuit 250 being embodied as the amplifier 250. In particular, the control circuit 200 is able to simultaneously increase all four currents I1, I2, I3 and I4 generated by the controllable current sources 110, 120, 130 and 140, as the level of the sensing signal Vx increases compared to a level of the reference signal Vrefx In this way, the undesired non-linear characteristic between the differential input signal and the output current resulting from the changing operating points of transistors 150 and 160 at large differential input signals can be flattened, while at the same time the bias current (and thus the power consumption) at small differential input signals stays small.

It has to be noted that the circuitry does not need a high gain regulation loop with stability issues to regulate the respective current portions I1, I2, I3 and I4 generated by the controllable current sources 110, 120, 130 and 140. Furthermore, any noise contributors of the circuitry are limited to the inherent circuit elements, for example transistors 150, 160, resistive elements 170, 180 and controllable current sources 110, ..., 140 which would have to somehow exist in any such transconductor circuitry.

Figure 2:
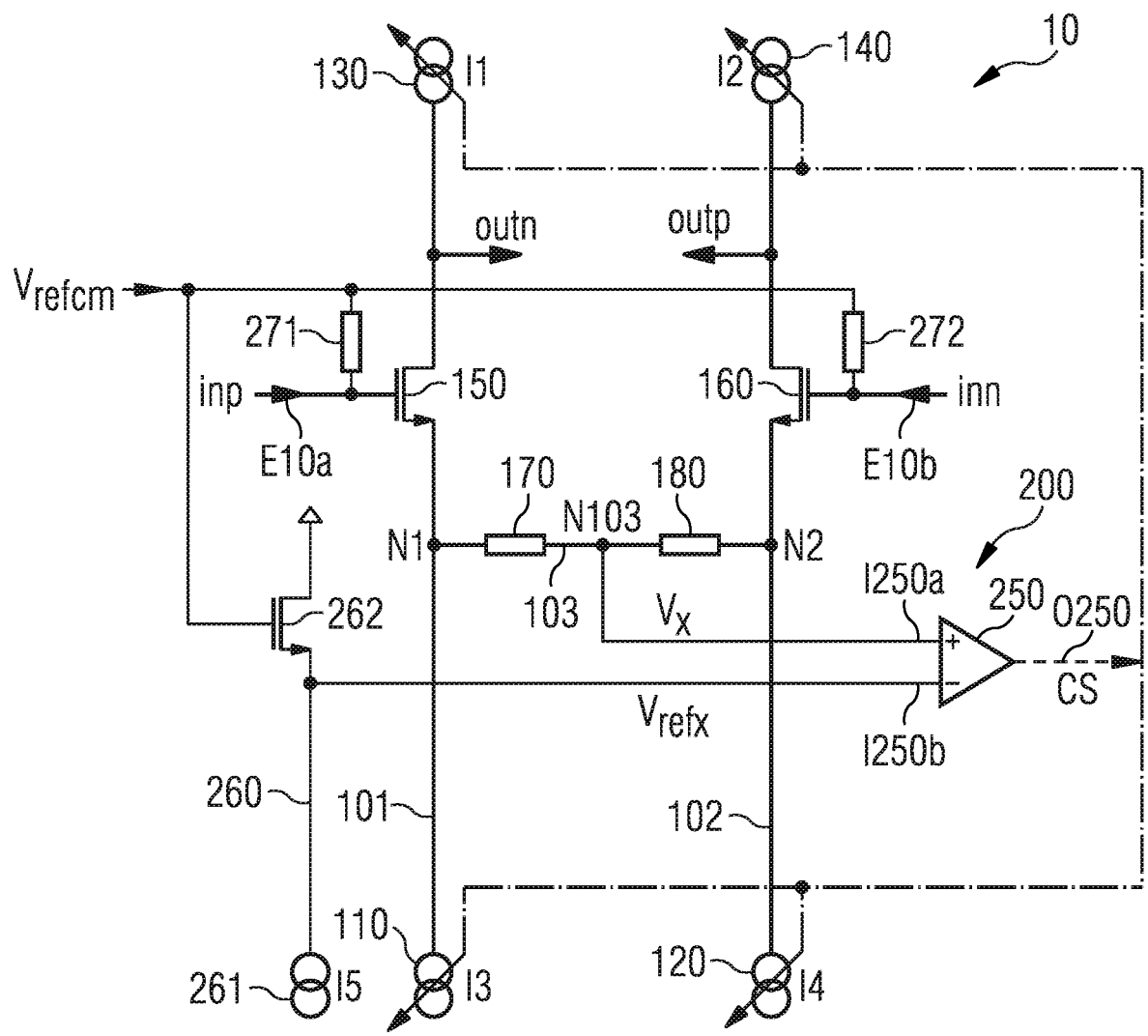
FIG. 2 shows a second embodiment of a transconductor circuitry with adaptive biasing in response to a differential input signal level of the transconductor circuitry.

FIG. 2 shows a second embodiment of a transconductor circuitry 10 with adaptive biasing, wherein a configuration of the control circuit 200 for generating the reference signal Vrefx is shown in detail. According to the embodiment illustrated in FIG. 2, the control circuit 200 comprises the regulation circuit 250 being configured as the amplifier 250 to generate the control signal CS to control the controllable current sources 110, ..., 140.

The control circuit 200 comprises a current path 260 comprising a constant current source 261 to generate a constant current I5 in the current path 260 and a level shifting transistor 262. A reference signal Vrefcm is applied to a control node of the level shifting transistor 262 and is further applied via a resistor 271 to the input terminal E10a and via a resistor 272 to the input terminal E10b.

The level shifting transistor 262, matching to transistors 150 and 160, is used to shift down the common mode reference voltage Vrefcm which also serves as a reference for the DC voltage biasing of the two high impedance input nodes E10a and E10b. While theoretically such a circuit topology could be feasible for certain applications that have a constant input common mode voltage, in a MEMS microphone application, it has to be considered that the input common mode voltage at the input terminals E10a and E10b is subject to change, for example directly with the input signals inp and inn if a single-ended topology is used, or as a result of transients on the high voltage MEMS sensor biasing node, and such changes are directly transferred to the internal node N103. As a consequence, the sensing signal Vx is influenced by the common mode voltage, thereby possibly disturbing the operation of the adaptive biasing.

Figure 3:
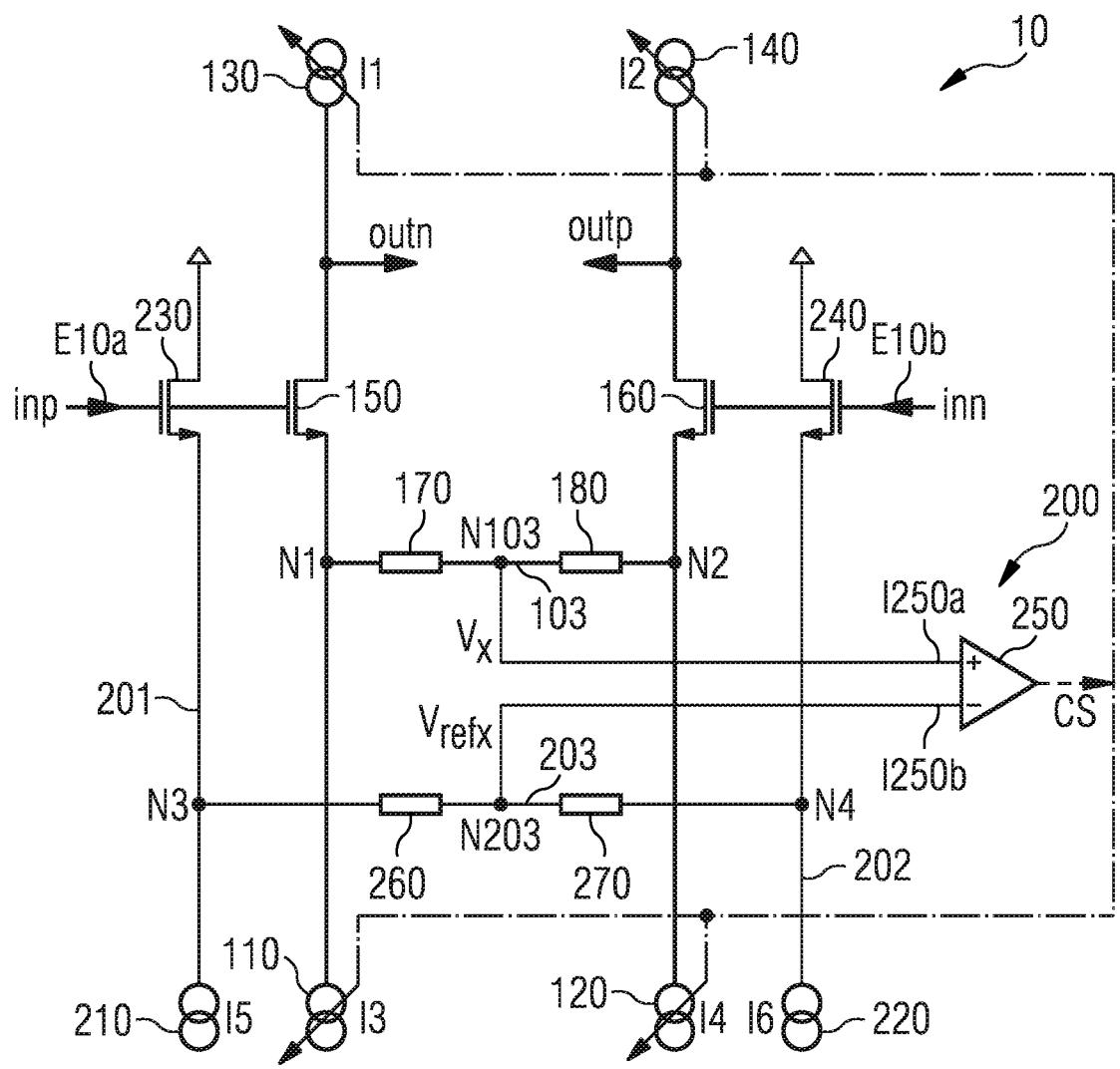
FIG. 3 shows a third embodiment of a transconductor circuitry with adaptive biasing in response to a differential input signal level of the transconductor circuitry.

FIG. 3 shows a third embodiment of the transconductor circuitry 10 with adaptive biasing, wherein the control circuit 200 includes another (improved) topology as compared with FIG. 2 to generate the reference signal Vrefx.

The control circuit 200 of the transconductor circuitry 10 of FIG. 3 comprises a current path 201 and a current path 202. The current path 201 includes a transistor 230 and a constant current source 210 to generate a biasing current of the transistor 230 in the current path 201. The transistor 230 has a control node being coupled to the input terminal E10a. The current path 202 includes a transistor 240 and a constant current source 220 to generate another biasing current of the transistor 240 in the current path 202. The transistor 240 has a control node being coupled to the input terminal E10b.

The input node I250b of the amplifier 250 is coupled to the current path 201 and the current path 202 so that the reference signal Vrefx is changed in response to a potential of a node N3 of the current path 201 and in response to a potential of a node N4 of the current path 202. The node N3 is located in the current path 201 between the transistor 230 and the constant current source 210. The node N4 is located in the current path 202 between the transistor 240 and the constant current source 220.

According to the embodiment of the transconductor circuitry 10 shown in FIG. 3, the control circuit 200 comprises a linking current path 203 being arranged between the node N3 of the current path 201 and the node N4 of the current path 202. The input node I250b of the amplifier 250 is connected to an internal node N203 of the linking current path 203.

As shown in FIG. 3, the linking current path 203 comprises a resistive element 260 and a resistive element 270 which may both be embodied as a resistor. The resistive element 260 is connected between the node N3 of the current path 201 and the internal node N203 of the linking current path 203. The resistive element 270 is connected between the node N4 of the current path 202 and the internal node N203 of the linking current path 203.

The configuration of the control circuit 200 of the transconductor circuitry 10 of FIG. 3 uses with the transistors 230 and 240 an auxiliary transistor pair which allows to generate the reference signal Vrefx that moves along with the input common mode voltage at the input terminals E10a and E10b. The amplifier stage 250 therefore only detects an increase of the level of the sensing signal Vx resulting from a change of the respective operation point of transistors 150 and 160, while the control circuit is immune against variations of the input common mode voltage. This makes the adaptive biasing scheme of the control circuit topology shown in FIG. 3 robust against such variations.

Regarding the respective embodiment of the transconductor circuitry shown in FIGS. 1 to 3, it has to be noted that the transistors 150 and 160 as well as the transistors 230 and 240 (FIG. 3) may be embodied as transistors of the n-type, for example NMOS transistors, or as transistors of the p-type, for example PMOS transistors. Furthermore, it is also possible that the transistors may be embodied as JFET transistors. The use of NMOS transistors advantageously enables to provide transistors with a suitable transconductance and a low area consumption.

The respective embodiment of the transconductor circuitry shown in FIGS. 1 to 3 comprise controllable current sources 110, 120, 130 and 140. It has to be noted that, to adjust the biasing current of the transistors 150 and 160, it is sufficient if each of the current paths 101 and 102 only comprises one controllable current source. Assuming the transistors 150 and 160 are of the n-type, for example embodied as NMOS transistors, only the current sources 110 and 120 need to be configured as controllable current sources while keeping the current of the current sources 130 and 140 constant. If the transistors 150 and 160 are realized as transistors of the p-type, for example embodied as PMOS transistors, it is necessary that only the current sources 130 and 140 are embodied as controllable current sources while keeping the current of the current sources 110 and 120 constant. In conclusion, by using only one controllable current source in each of the current paths 101 and 102, the topology of the transconductor circuitry 10 can be simplified by accepting a variable output common mode current.

According to another possible embodiment cascode transistors may be provided at the drain nodes of the transistors 150, 160 which allows to improve the output impedance of the transconductor circuitry.

The illustrated embodiments of the transconductor circuitry 10 shown in FIGS. 1 to 3 comprise resistive elements 170, 180 in the linking current path 103 and resistive elements 260 and 270 in the linking current path 203. According to a modified embodiment of the transconductor circuitry 10 of FIGS. 1 to 3, the resistive elements 170 and 180 can be removed/set to zero. In this case the nodes N1 and N2 are directly connected. Optionally, also the resistive elements 260 and 270 may be removed/set to zero so that the Nodes N3 and N4 are directly connected with each other. Such a simplified topology of the transconductor circuitry enables the area consumption of the circuitry to be reduced.

According to a possible embodiment of the transconductor circuitries 10 shown in FIGS. 1 to 3, it is possible to add a deliberate input voltage offset to the amplifier stage 250 of the control circuit 200. This modification advantageously enables to ensure that the control of the adaptive biasing procedure does not start before a certain signal level of the differential input signal is reached.

Figure 4A:
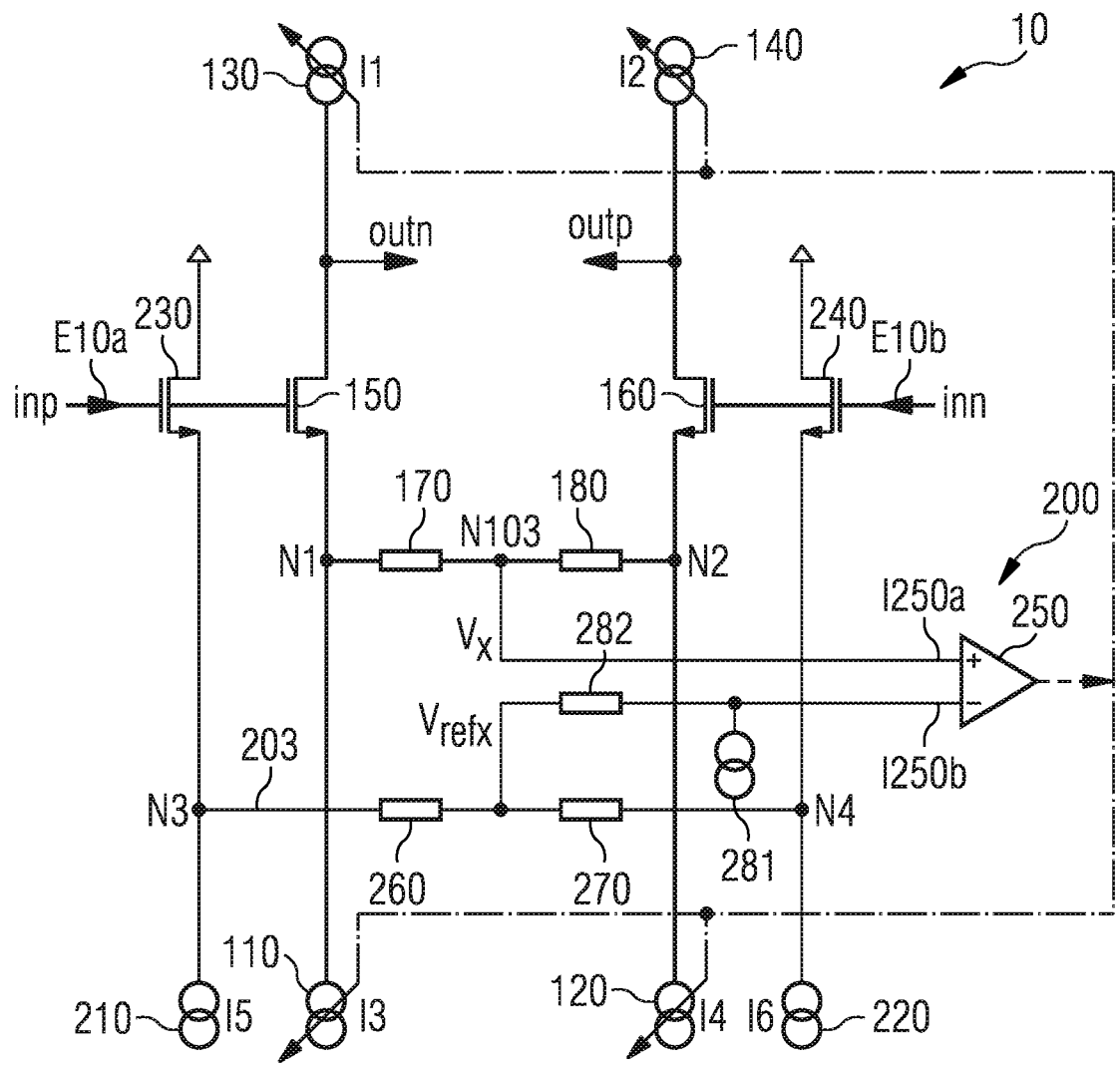
FIG. 4A shows a first modification of a control circuit of a transconductor circuitry with adaptive biasing.
Figure 4B:
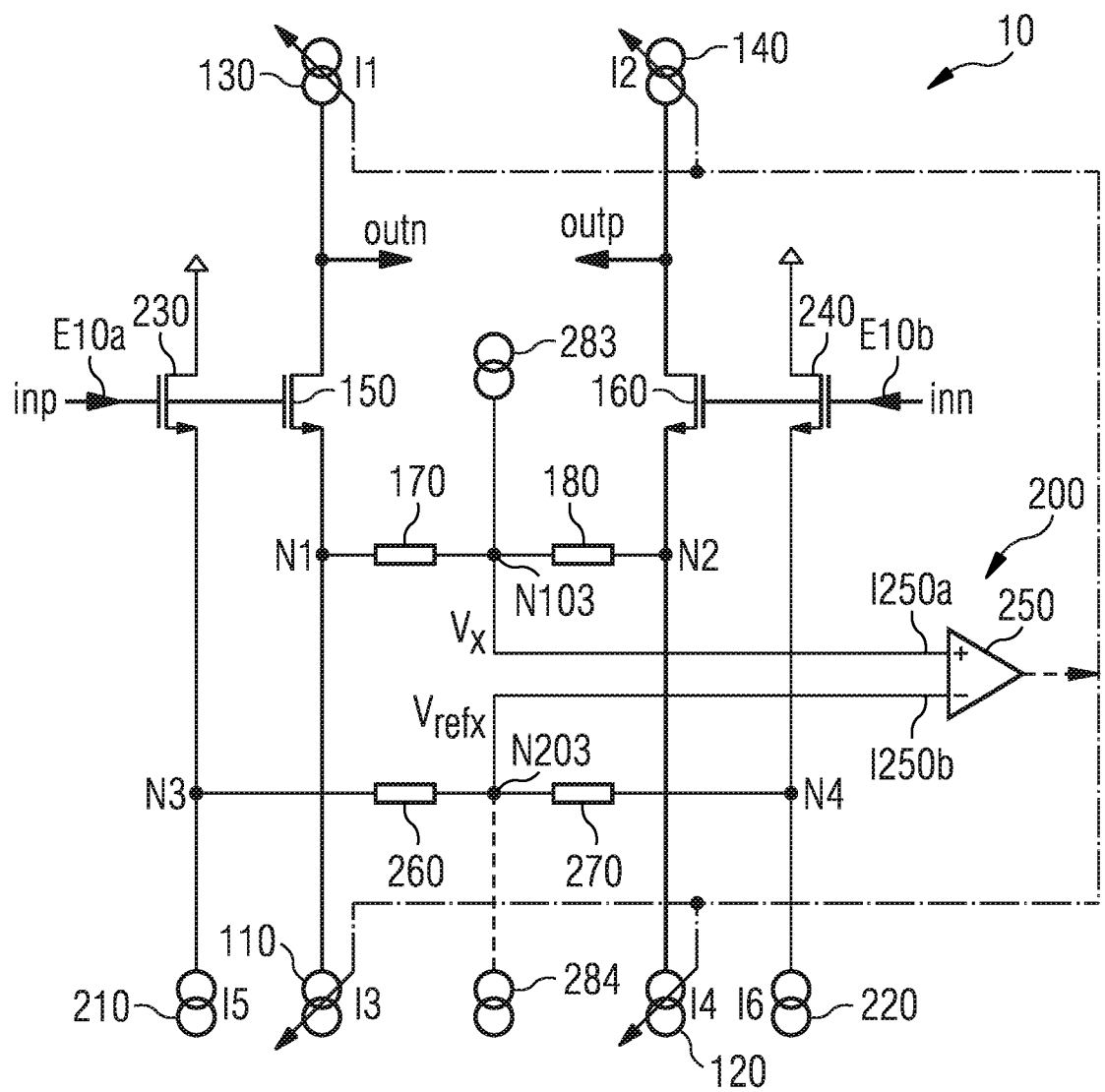
FIG. 4B shows a second modification of a control circuit of a transconductor circuitry with adaptive biasing.

FIGS. 4A and 4B show a possible implementation to add the input voltage offset to the control circuit 200. According to the embodiment of the transconductor circuitry 10 shown in FIG. 4A, a current source 281 with a resistor 282 is coupled to the input node I250b, for example the inverting input node, of the amplifier 250. According to another possible embodiment, the input voltage offset may be added to the control circuit 200 by providing a current source or current sink 283 applied to the internal node N103 between the resistive elements 170 and 180, as illustrated in FIG. 4B. FIG. 4B shows in dashed lines an alternative embodiment to add the input voltage offset to the amplifier stage 250 by providing a current source or current sink 284 applied to the internal node N203 between the resistive elements 260 and 270.

Figure 4C:
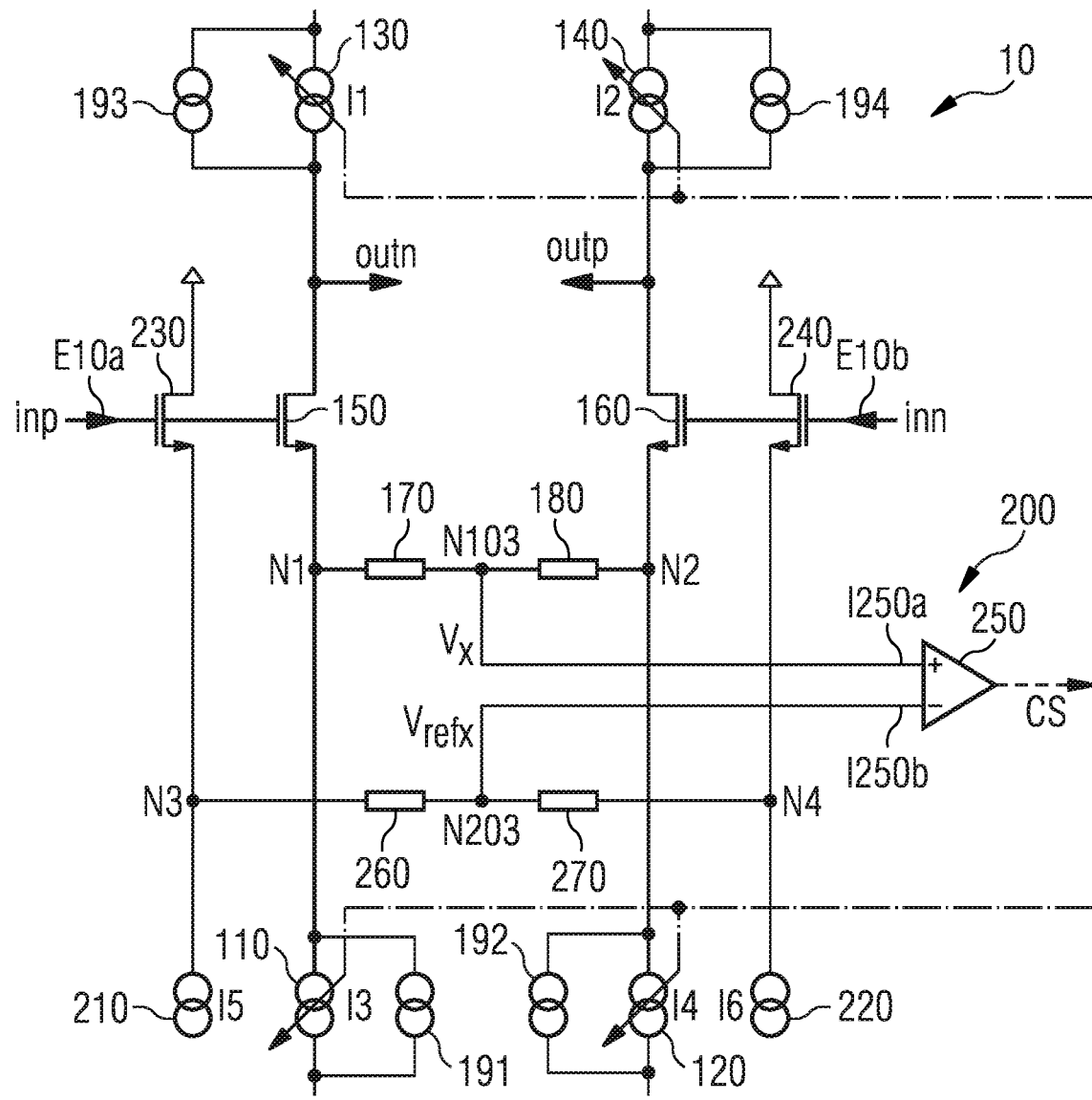
FIG. 4C shows a third modification of a control circuit of a transconductor circuitry with adaptive biasing.

FIG. 4C shows an embodiment of the transconductor circuitry 10 of FIG. 1, wherein a respective constant current source 191, 192, 193 and 194 is connected in parallel to each of the controllable current sources 110, 120, 130 and 140. The adding of constant/non-adjustable current sources 191, . . . , 194 in parallel to the controllable/adjustable current sources 110, . . . , 140 advantageously enables that a defined biasing current can be established even without the adaptive biasing becoming active. The adding of the constant current sources 191, . . . , 194 in parallel to the controllable current sources is shown in FIG. 4C only for the configuration of the transconductor circuitry 10 of FIG. 1 but may be also used for the embodiments of the transconductor circuitry 10 shown in FIGS. 2 and 3.

According to a possible embodiment of the transconductor circuitry, parts or all of the current sources 110 and 120 can be added to the internal node N103 between the resistive elements 170 and 180. According to an alternative embodiment, parts or all of the current sources 110 and 120 can be connected to an additional node pair obtained by splitting the two resistive elements 170 and 180 into four resistive elements. In the same way parts or all of the current sources 210 and 220 can be connected to the internal node N203 between the resistive elements 260 and 270. According to an alternative embodiment, parts or all of the constant current sources 210 and 220 can be coupled to an additional node pair obtained by splitting the resistive elements 260 and 270 into four resistive elements.

Figure 5:
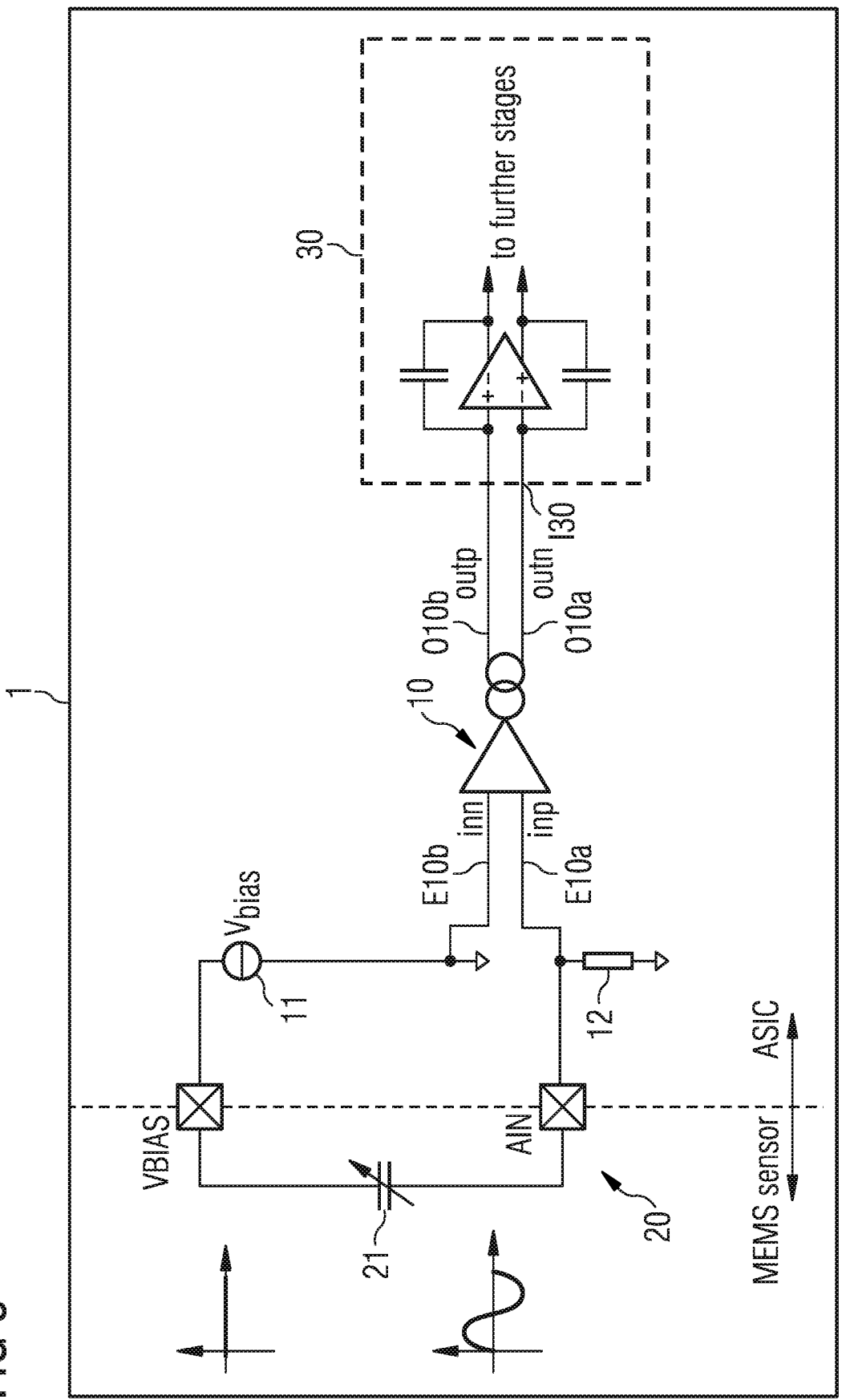
FIG. 5 illustrates an embodiment of a sensor device including a transconductor circuitry with adaptive biasing.

FIG. 5 shows an application of a sensor device 1 in which the transconductor circuitry 10 with adaptive biasing may be used as an interface between a sensor 20 and an analog-to-digital converter 30. The sensor device 1 comprises the transconductor circuitry 10 with adaptive biasing which is configured to generate an output current signal outp, outn. The sensor 20 may be embodied as, for example, one of a MEMs microphone or a pressure sensor or a resistive sensor or an inductive sensor or a capacitive sensor or a seismic sensor.

The sensor 20 includes a transducer 21 to detect an environmental signal impacting on the transducer 21. The transducer 21 is configured to generate voltage signals inn, inp in response to the environmental signal. The analog-to-digital converter 30 has an input side 130 to receive the output current signals outp, outn. The analog-to-digital converter 30 is configured to generate a digital output signal in response to the output current signal outn, outp. According to a possible embodiment, the analog-to-digital converter 30 may be configured as a converter with continuous timing.

The transconductor circuitry 10 is connected to the sensor 20 to receive the voltage signals inp, inn from the sensor 20 at the input terminals E10a and E10b. The transconductor circuitry 10 is further connected to the analog-to-digital converter 30 to provide the output current signals outp, outn to the input side 130 of the analog-to-digital converter 30. The transconductor circuitry 10 and the analog-to-digital converter 30 may be embodied as an ASIC stage.

Regarding the sensor device 1, the transconductor circuitry 10 is used as a sensor input stage which allows the biasing of the input transistors to be adjusted according to the level of the differential input signal. In particular, the transconductor circuitry is configured to use the sensing signal Vx, for example tapped between the degeneration resistors 170 and 180, and the reference signal Vrefx tapped at the source nodes of an auxiliary transistor pair to derive the required biasing current.

The transconductor circuitry 10 may advantageously be implemented without using extra noise contributors apart from the inherently present components, for example input transistors and their bias current sources and degeneration resistors. Another advantage is that the power consumption is low when applying small differential input signals, increasing only with larger differential input signals. This is beneficial for audio applications, because the differential input signal is usually small most of the time. The transconductor circuitry 10 only shows low noise at small differential input signals, increasing only with larger differential input signals. The noise increase for large differential input signals is usually acceptable for audio applications, because the maximum SNR (signal-to-noise ratio) the human hearing can perceive is limited. Furthermore, the design of the circuitry allows the trade-off between THD (Total Harmonic Distortion) and power consumption to be adjusted efficiently during design. The provision of a high gain regulation loop which is costly to make stable at large signal dynamic range is not necessary.

LIST OF REFERENCE SIGNS 1 sensor device
10 transconductor circuitry
20 sensor
21 transducer
30 analog-to-digital converter
101, 102 current path
110, . . . , 140 controllable current source
150, 160 transistor
170, 180 resistive element
200 control circuit
201, 202 current path
210, 220 constant current source
230, 240 transistor
250 amplifier
260, 270 resistive element
N1, . . . , N4 node
N103, N203 internal node
103, 203 linking current path
inp, inn input signal
outn, outp output signal

The invention claimed is:

1. A transconductor circuitry with adaptive biasing, comprising:
a first input terminal to apply a first input signal,
a second input terminal to apply a second input signal,
a first current path including a first transistor and a first controllable current source to adjust a first biasing current of the first transistor in the first current path, the first transistor having a control node being coupled to the first input terminal,
a second current path including a second transistor and a second controllable current source to adjust a second biasing current of the second transistor in the second current path, the second transistor having a control node being coupled to the second input terminal,
a control circuit comprising an amplifier having an output node to generate a control signal to control the first and the second controllable current source in response to at least one of a first potential of a first node of the first current path and a second potential of a second node of the second current path,
wherein the first node is located between the first transistor and the first controllable current source, and the second node is located between the second transistor and the second controllable current source.

2. The transconductor circuitry of claim 1,
wherein the amplifier comprises a first input node,
wherein the first input node is coupled to the first and the second current path in a way so that a sensing signal at the first input node of the amplifier is changed in response to at least one of the first potential at the first node and the second potential at the second node.

3. The transconductor circuitry of claim 2,
wherein the amplifier comprises a second input node to apply a reference signal,
wherein the amplifier is configured to generate the control signal in response to the sensing signal and the reference signal.

4. The transconductor circuitry of claim 2, comprising:
a first linking current path being arranged between the first node of the first current path and the second node of the second current path,
wherein the first input node of the amplifier is connected to a first internal node of the first linking current path.

5. The transconductor circuitry of claim 4,
wherein the first linking current path comprises a first resistive element and a second resistive element,
wherein the first resistive element is connected between the first node of the first current path and the first internal node of the first linking current path,
wherein the second resistive element is connected between the second node of the second current path and the first internal node of the first linking current path.

6. The transconductor circuitry of claim 1,
wherein the first current path includes a third controllable current source,
wherein the second current path includes a fourth controllable current source,
wherein the control circuit is configured to control the third and the fourth controllable current source in response to at least one of the first potential at the first node of the first current path and the second potential at the second node of the second current path.

7. The transconductor circuitry of claim 6, wherein the control circuit is configured to generate the control signal by the amplifier to control the first and the second controllable current source and the third and the fourth controllable current source in response to a sensing signal detected at the first internal node of the first linking current path.

8. The transconductor circuitry of claim 3,
wherein the control circuit comprises a third current path and a fourth current path,
wherein the third current path includes a third transistor and a first constant current source to generate a biasing current of the third transistor in the third current path, the third transistor having a control node being coupled to the first input terminal,
wherein the fourth current path includes a fourth transistor and a second constant current source to generate another biasing current of the fourth transistor in the fourth current path, the fourth transistor having a control node being coupled to the second input terminal,
wherein the second input node of the amplifier is coupled to the third and the fourth current path so that the reference signal is changed in response to a third potential at a third node of the third current path and a fourth potential at a fourth node of the fourth current path,
wherein the third node is located between the third transistor and the first constant current source, and the fourth node is located between the fourth transistor and the second constant current source.

9. The transconductor circuitry of claim 8,
wherein the control circuit comprises a second linking current path being arranged between the third node of the third current path and the fourth node of the fourth current path,
wherein the second input node of the amplifier is connected to a second internal node of the second linking current path.

10. The transconductor circuitry of claim 9,
wherein the second linking current path comprises a third resistive element and a fourth resistive element,
wherein the third resistive element is connected between the third node of the third current path and the second internal node of the second linking current path,
wherein the fourth resistive element is connected between the fourth node of the fourth current path and the second internal node of the second linking current path.

11. The transconductor circuitry of claim 10,
wherein the control circuit comprises a current sink that is coupled to the first internal node of the first linking current path, or
wherein the control circuit comprises a third constant current source that is coupled to the second internal node of the second linking current path.

12. The transconductor circuitry of claim 6, wherein a respective fifth constant current source is connected in parallel to each of the first controllable current source, the second controllable current source, the third controllable current source and the fourth controllable current source.

13. A sensor device, comprising:
a transconductor circuitry with adaptive biasing according to claim 1, the transconductor circuitry being configured to generate an output current signal,
a sensor including a transducer to detect an environmental signal impacting on the transducer, wherein the transducer is configured to generate a voltage signal in response to the environmental signal,
an analog-to-digital converter having an input side to receive the output current signal, the analog-to-digital converter being configured to generate a digital output signal in response to the output current signal,
wherein the transconductor circuitry is connected to the sensor to receive the voltage signal from the sensor at the first and second input terminal of the transconductor circuitry, and is further connected to the analog-to-digital converter to provide the output current signal to the input side of the analog-to-digital converter.

14. The sensor device of claim 13, wherein the sensor is embodied as one of a MEMS microphone, a pressure sensor, a resistive sensor, an inductive sensor, a capacitive sensor or a seismic sensor.

* * * * *